US010096473B2

United States Patent
Kelman et al.

(10) Patent No.: US 10,096,473 B2
(45) Date of Patent: Oct. 9, 2018

(54) FORMATION OF A LAYER ON A SEMICONDUCTOR SUBSTRATE

(71) Applicant: AIXTRON SE, Herzogenrath (DE)

(72) Inventors: Maxim Kelman, Mountain View, CA (US); Zhongyuan Jia, Cupertino, CA (US); Somnath Nag, Saratoga, CA (US); Robert Ditizio, Petaluma, CA (US)

(73) Assignee: AIXTRON SE, Herzogenrath (DE)

( * ) Notice: Subject to any disclaimer, the term of this patent is extended or adjusted under 35 U.S.C. 154(b) by 0 days.

(21) Appl. No.: 15/093,003

(22) Filed: Apr. 7, 2016

(65) Prior Publication Data

US 2017/0294306 A1   Oct. 12, 2017

(51) Int. Cl.
| | | |
|---|---|---|
| H05H 1/00 | (2006.01) |
| C23C 16/02 | (2006.01) |
| H01L 21/02 | (2006.01) |
| C23C 16/50 | (2006.01) |
| C23C 16/52 | (2006.01) |

(52) U.S. Cl.
CPC ........ *H01L 21/02634* (2013.01); *C23C 16/50* (2013.01); *C23C 16/52* (2013.01); *H01L 21/02381* (2013.01); *H01L 21/02538* (2013.01); *H01L 21/02658* (2013.01); *H01L 21/02661* (2013.01); *H01L 21/02694* (2013.01)

(58) Field of Classification Search
CPC ......... H01L 21/02634; H01L 21/02381; H01L 21/02538; H01L 21/02546; H01L 21/026
USPC ..... 427/532, 533, 534, 535, 255.23, 255.28, 427/255.395, 255.26, 255.27; 438/478, 438/503, 507
See application file for complete search history.

(56) References Cited

U.S. PATENT DOCUMENTS

| | | |
|---|---|---|
| 5,968,279 A | 10/1999 | MacLeish et al. |
| 6,391,748 B1 | 5/2002 | Temkin et al. |
| 8,524,562 B2 | 9/2013 | Wang et al. |

(Continued)

OTHER PUBLICATIONS

Merckling; et al., "Heteroepitaxy of InP on Si(001) by selective-area metal organic vapor-phase epitaxy in sub-50nm width trenches: The role of the nucleation layer and the recess engineering", Journal of Applied Physics (2014), 115:023710-1-6.

(Continued)

*Primary Examiner* — Dah-Wei D. Yuan
*Assistant Examiner* — Nga Leung V Law
(74) *Attorney, Agent, or Firm* — Ascenda Law Group, PC

(57) ABSTRACT

Described herein are techniques for forming an epitaxial III-V layer on a substrate. In a pre-clean chamber, a native oxygen layer may be replaced with a passivation layer by treating the substrate with a hydrogen plasma (or products of a plasma decomposition). In a deposition chamber, the temperature of the substrate may be elevated to a temperature less than 700° C. While the substrate temperature is elevated, a group V precursor may be flowed into the deposition chamber in order to transform the hydrogen terminated (Si—H) surface of the passivation layer into an Arsenic terminated (Si—As) surface. After the substrate has been cooled, a group III precursor and the group V precursor may be flowed in order to form a nucleation layer. Finally, at an elevated temperature, the group III precursor and group V precursor may be flowed in order to form a bulk III-V layer.

1 Claim, 5 Drawing Sheets

(56) References Cited

U.S. PATENT DOCUMENTS

| | | | |
|---|---|---|---|
| 8,603,898 B2* | 12/2013 | Bao | H01L 21/02381 |
| | | | 117/202 |
| 2003/0045063 A1* | 3/2003 | Oda | C23C 16/22 |
| | | | 438/309 |
| 2010/0200956 A1* | 8/2010 | Shibata | C30B 25/18 |
| | | | 257/617 |
| 2010/0255661 A1 | 10/2010 | Vatus et al. | |
| 2011/0081771 A1 | 4/2011 | Su | |
| 2015/0050753 A1 | 2/2015 | Srinivasan et al. | |
| 2016/0141391 A1* | 5/2016 | Merckling | H01L 29/20 |
| | | | 257/288 |

OTHER PUBLICATIONS

Qiang; et al., "Growth of ultra-high mobility In0.52AI0.48As/InxGa1-xAs (x≥53%) quantum wells on Si substrates using InP/GaAs buffers by metalorganic chemical vapor deposition", Applied Physics Express (2014), 7(4):045502-1-4.

International Search Report and Written Opinion dated Jun. 23, 2017, from the International Searching Authority, for International Patent App. No. PCT/EP2017/057906 (filed Apr. 4, 2017), 11 pages.

* cited by examiner

FORMATION OF A LAYER ON A SEMICONDUCTOR SUBSTRATE

FIELD OF THE INVENTION

The present invention relates to methods and systems for forming a layer on a substrate, in particular forming an epitaxial III-V layer on a substrate, and further relates to forming the epitaxial III-V layer without heating the substrate above 700° C.

BACKGROUND

Prior to any processing, a substrate (e.g., a semiconductor wafer) will typically have a native oxide layer due to exposure to oxygen in the ambient air. When depositing an epitaxial III-V layer (i.e., a layer including group III and group V elements from the periodic table) on the substrate, it is not desirable to deposit the III-V layer over the native oxide layer. Below, techniques are discussed for forming a III-V layer on a substrate in the context where a native oxide layer is initially present on a surface of the substrate.

SUMMARY OF THE INVENTION

In accordance with one embodiment of the invention, a native oxide layer may be removed from a substrate in a pre-clean chamber, for example using a plasma (e.g., a hydrogen plasma). The plasma processing may replace the native oxide layer with a passivation layer (e.g., a hydrogen terminated surface), and may take place at a first temperature, $T_1$, which is above room temperature. The substrate may then be transported from the pre-clean chamber to a deposition chamber, for example in an oxygen-free environment of a transfer module to prevent a native layer from reforming on the surface of the substrate. While in the transfer module, the substrate may be cooled from $T_1$ to a second temperature, $T_2$.

In the deposition chamber, the substrate may be heated from $T_2$ to a third temperature, $T_3$, and then cooled from $T_3$ to a fourth temperature, $T_4$. While the substrate is at an elevated temperature (i.e., higher than $T_2$ or $T_4$), a group V precursor may be flowed into the deposition chamber to transform the hydrogen terminated (Si—H) surface into an Arsenic terminated (Si—As) surface, thereby removing the passivation layer. At $T_4$, the flow of the group III precursor may be started while the flow of the group V precursor is maintained. The flow of the group III and group V precursors may form a III-V nucleation layer on the surface of the substrate. After formation of the III-V nucleation layer, the flow of the group III precursor may be stopped and the substrate may be heated to a fifth temperature, $T_5$. At $T_5$, the flow of group III precursor may be re-started while the flow of the group V precursor is maintained. The flow of the group III and group V precursors may form a bulk III-V layer (e.g., on the order of 500 nm in thickness). After formation of the bulk III-V layer, the group III precursor may be stopped, after which the substrate temperature may be cooled from $T_5$ to a sixth temperature, $T_6$. When the substrate temperature has reached $T_6$, the flow of the group V precursor may be stopped.

These and other embodiments of the invention are more fully described in association with the drawings below.

DETAILED DESCRIPTION OF THE INVENTION

In the following detailed description of the preferred embodiments, reference is made to the accompanying drawings that form a part hereof, and in which are shown by way of illustration specific embodiments in which the invention may be practiced. It should be understood that other embodiments may be utilized and structural changes may be made without departing from the scope of the present invention. Description associated with any one of the figures may be applied to a different figure containing like or similar components/steps. While the sequence diagrams each present a series of steps in a certain order, the order of some of the steps may be changed.

Figure 1:
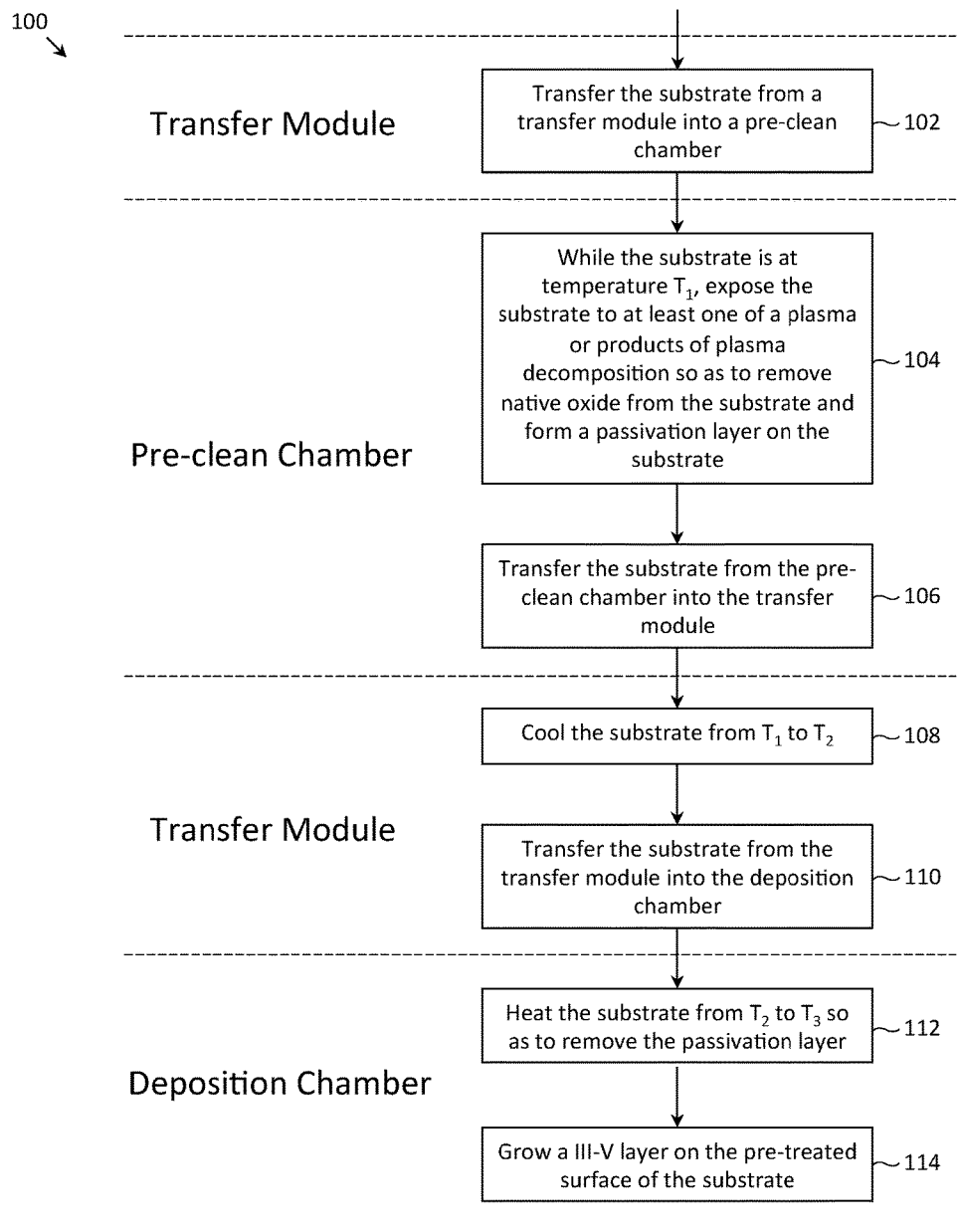
FIG. 1 depicts a flow diagram that describes a process for pre-treating a surface of a substrate and growing an epitaxial III-V layer on the pre-treated surface, in accordance with one embodiment of the present invention.

FIG. 1 depicts a flow diagram that describes a process for pre-treating a surface of a substrate (e.g., a Silicon wafer) and growing an epitaxial III-V layer on the pre-treated surface, in accordance with one embodiment of the invention. At step 102, the substrate may be transferred from a transfer module into a pre-clean chamber. The substrate may initially be at room temperature when transferred into the pre-clean chamber. While in the pre-clean chamber, the substrate may be exposed to a plasma, products of plasma decomposition, or both the plasma and the products of plasma decomposition so as to remove native oxide from a surface of the substrate and form a passivation layer on the surface of the substrate. In one embodiment, the plasma is a hydrogen gas ($H_2$) plasma (e.g., pure hydrogen gas plasma), and an area of a region where the $H_2$ plasma is formed may be substantially equal in size to an area of a top surface of the substrate. In one embodiment, products of plasma decomposition are formed by passing hydrogen gas (or a mixture of $H_2$ with an inert gas such as He gas) through a plasma. In the instance where a Silicon wafer is exposed to a hydrogen gas plasma, the passivation layer may comprise a passivated, i.e., hydrogen terminated (Si—H), surface.

During the plasma processing, the temperature of the substrate may be controlled to be at a temperature, $T_1$, which is greater than room temperature and less than 650° C. Preferably, $T_1$ is between 400° C. and 600° C. The substrate may be heated by a susceptor, or other temperature control means.

At step 106, the substrate may be transferred from the pre-clean chamber back into the transfer module. In the transfer module, the substrate may be cooled (step 108) from temperature $T_1$ to a temperature, $T_2$, which is less than $T_1$.

At step 110, the substrate may be transferred from the transfer module into the deposition chamber. Importantly, the transfer module provides an oxygen-free environment for the transport, preventing an oxide from reforming on the surface of the substrate.

In the deposition chamber (in some embodiments, an Epi-module), the substrate may be heated from $T_2$ to a temperature, $T_3$, which is greater than 50° C. and less than 700° C. (step 108). Preferably, $T_3$ is between 450° C. and 700° C. $T_3$ being below 700° C. offers several advantages, including a lower thermal budget, higher throughput and lower cost of ownership.

The heating of the substrate in step 112 is performed so as to remove the passivation layer. In one embodiment, the heating of the substrate in step 112 is performed while injecting a group V precursor (e.g., Arsine, TBAs (Tertiarybutylarsine), etc.) into the deposition chamber. In the instance where the group V precursor is Arsine, removing the passivation layer comprises transforming the hydrogen terminated (Si—H) surface into an Arsenic terminated (Si—As) surface. At step 114, a III-V layer may be grown on the pre-treated surface (e.g., the Arsenic terminated surface) of the substrate (further described in FIG. 2).

Figure 2:
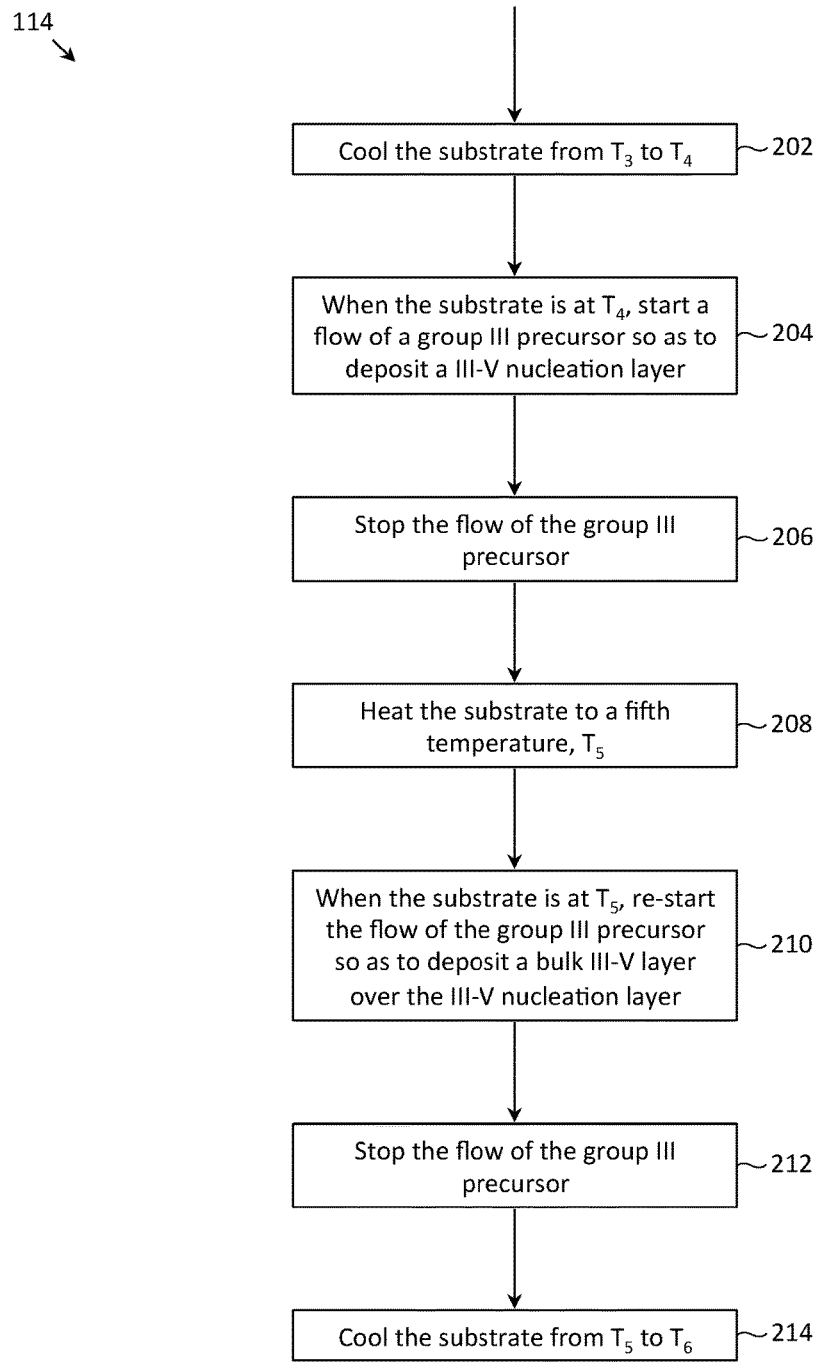
FIG. 2 depicts a flow diagram that describes a process for growing an epitaxial III-V layer on the pre-treated surface of the substrate, in accordance with one embodiment of the present invention.

FIG. 2 depicts a flow diagram that describes a process for growing an epitaxial III-V layer on the pre-treated surface of the substrate, in accordance with one embodiment of the invention. At step 202, the substrate may be cooled from $T_3$ to a temperature, $T_4$, which may be lower than 450° C. (while the flow of the group V precursor is maintained). At step 204, when the substrate is at $T_4$, a flow of a group III precursor (e.g., TMGa, TEGa (Triethyl Gallium), etc.) may be started (while the flow of the group V precursor is maintained). The flow of the group III and group V precursors may deposit a III-V nucleation layer on the pre-cleaned surface of the substrate. At step 206, the flow of the group III precursor may be stopped while the substrate temperature is less than $T_4$. At step 208, the substrate may be heated to a temperature, $T_5$ (e.g., a bulk growth temperature), which may be approximately 600° C. When the substrate is at $T_5$, the flow of the group III precursor may be re-started (while the flow of the group V precursor is maintained) so as to deposit a bulk III-V layer over the III-V nucleation layer (step 210). At step 212, the flow of the group III precursor may be stopped (while the flow of the group V precursor is maintained). At step 214, the substrate may be cooled from $T_5$ to a temperature, $T_6$, which may be greater than a transfer temperature (while the flow of the group V precursor is maintained). At $T_6$, the flow of the group V precursor may be stopped.

While not depicted in FIG. 2, the substrate temperature may be further cooled to a temperature, $T_7$ (e.g., a transfer temperature) before being transported out of the deposition chamber. The transfer temperature may be greater than or equal to room temperature. Further, while not depicted in FIG. 2, it is understood that additional layers (e.g., an additional III-V layer, a semiconductor layer, an insulator layer, a metal layer, etc.) may be deposited on top of the bulk III-V layer after step 214.

Figure 3:
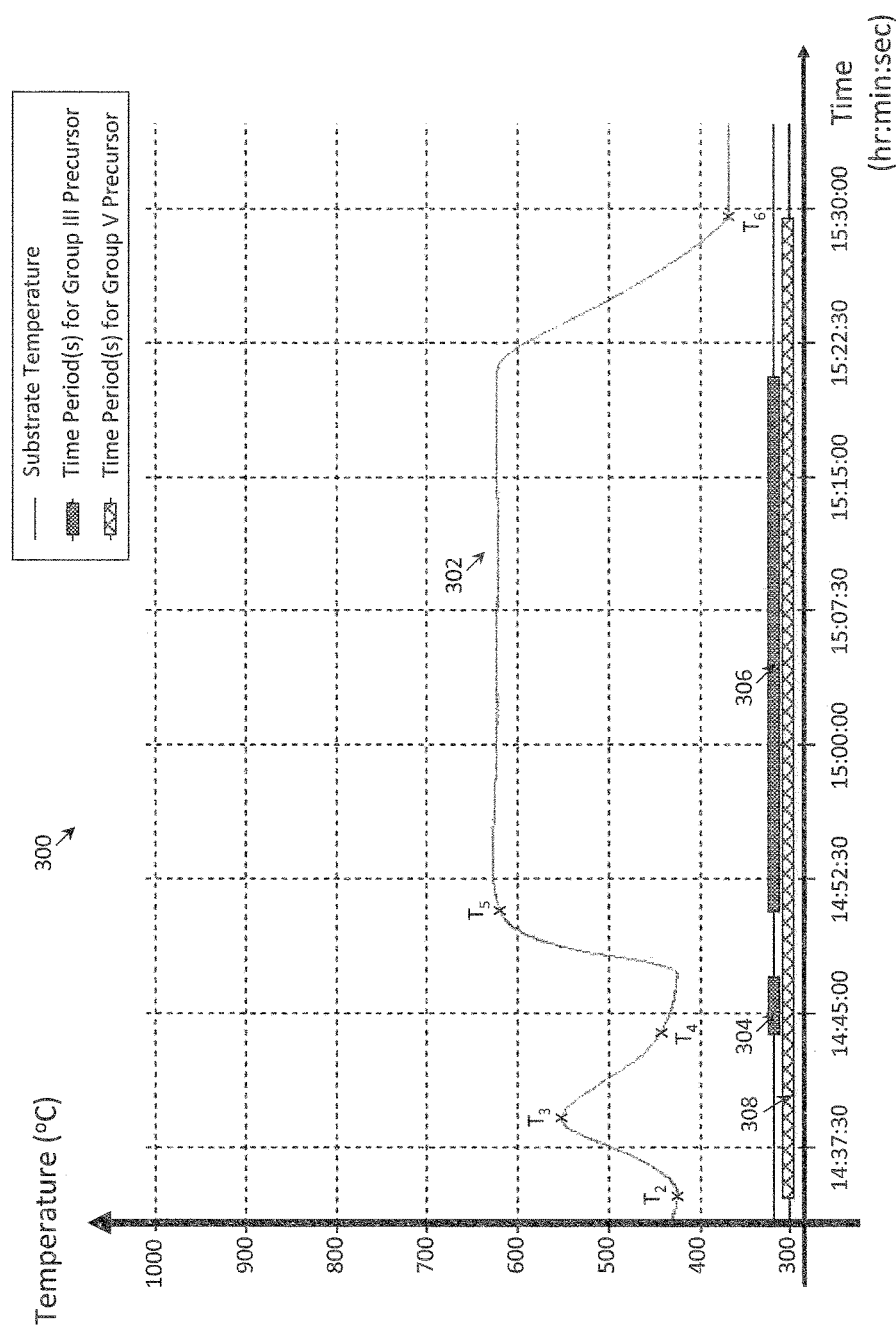
FIG. 3 depicts a plot of substrate temperature versus time while the substrate is located in the deposition chamber, and overlaid therein are bars indicating time periods during which group III and group V precursors may be injected into the deposition chamber, in accordance with one embodiment of the present invention.

FIG. 3 depicts plot 300 of substrate temperature versus time (element 302) while the substrate is located in the deposition chamber, in accordance with one embodiment of the invention. Overlaid in plot 300 are bars indicating time periods during which group III and group V precursors may be injected into the deposition chamber. As shown in plot 300, the substrate may be heated from $T_2$ to $T_3$ to remove the passivation layer from the substrate. The substrate may then be cooled from $T_3$ to $T_4$. During time period 304 (which may commence when the substrate is at $T_4$), group III precursor may be flowed into the deposition chamber (while flowing the group V precursor) in order to form the III-V nucleation layer. As shown in plot 300, the substrate temperature may continue to be cooled below $T_4$ during the formation of the III-V nucleation layer. At the conclusion of period 304, the substrate may be heated to $T_5$.

During time period 306 (which may commence when the substrate is at $T_5$), group III precursor may be flowed into the deposition chamber (while flowing the group V precursor) in order to form the bulk III-V layer. At the end of time period 306, the substrate may be cooled from $T_5$ to $T_6$. When the substrate has been cooled to $T_6$, the flow of the group V precursor may be stopped.

It is noted that there may be some flexibility in the time at which time period 308 (during which the group V precursor is flowed) is started. In the embodiment depicted in plot 300, time period 308 begins when the substrate is at $T_2$. In other embodiments (not depicted), time period 308 may begin while the substrate is being heated from $T_2$ to $T_3$, while the substrate is at $T_3$, or while the substrate is being cooled from $T_3$ to $T_4$.

Figure 4:
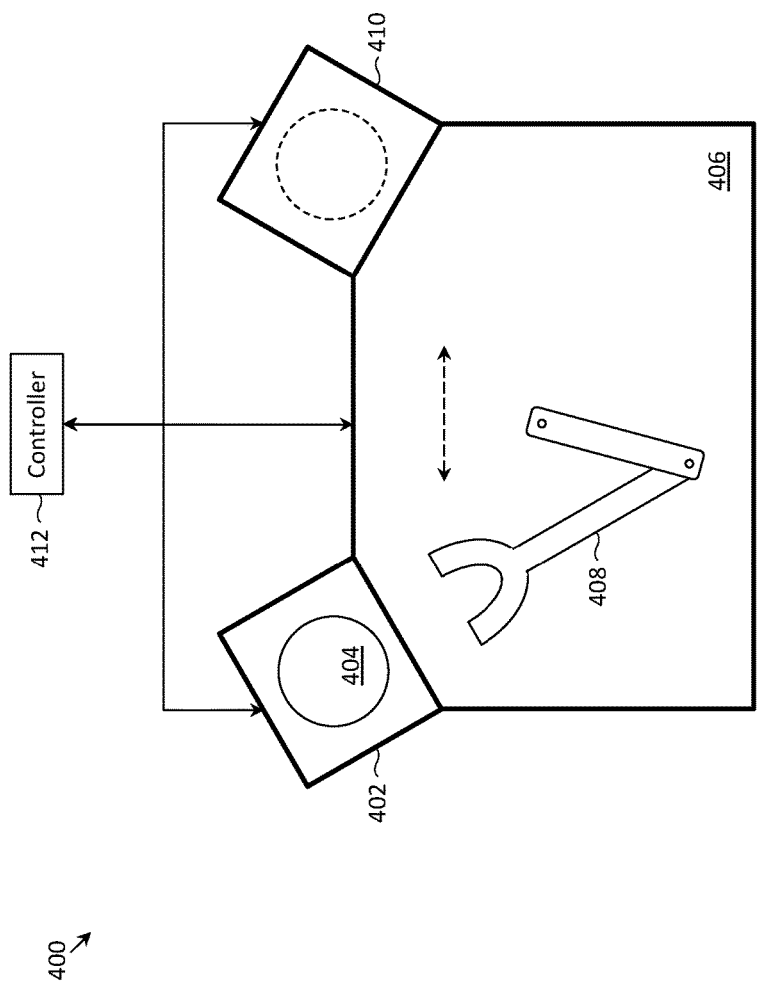
FIG. 4 depicts a processing apparatus comprising a pre-clean chamber, a transfer module, a deposition chamber and a controller, in accordance with one embodiment of the present invention.

FIG. 4 depicts processing apparatus 400 comprising pre-clean chamber 402, a transfer module 406, deposition chamber 410 and controller 412, in accordance with one embodiment. A transfer mechanism 408 (e.g., substrate holder, etc.) disposed within transfer module 406 may be used to transfer substrate 404 from pre-clean chamber 402 to deposition chamber 410. As noted above, transfer module may provide an oxygen-free environment for transport, which prevents an oxide from reforming on a surface of substrate 404. While a single substrate, a single pre-clean chamber and a single deposition chamber have been depicted in FIG. 4, this is for ease of illustration and explanation. In other embodiments, a plurality of pre-clean chambers and a plurality of deposition chambers may be coupled to transfer module 406 to more efficiently process a plurality of substrates (in such case, the processing apparatus may be called a "cluster tool"). Further, it is noted that a plurality of substrates can be processed within each of the pre-clean and deposition chambers.

In one embodiment of the invention, controller 412 may be used to automate processes 100 and 114 described above in FIGS. 1 and 2, respectively. More specifically, controller 412 may instruct pre-clean chamber 402 to expose substrate 404 to a plasma, products of plasma decomposition, or both the plasma and the products of plasma decomposition so as to remove native oxide from the substrate and form a passivation layer on the substrate. The plasma processing may take place while the substrate is at a first temperature, $T_1$, greater than room temperature. Further, controller 412 may instruct transfer module 406 to transfer, in an oxygen-free environment, substrate 404 from pre-clean chamber 402 to deposition chamber 410, and while in the oxygen-free environment, cool the substrate from $T_1$ to a second temperature, $T_2$, which is less than $T_1$. Lastly, controller 412 may instruct deposition chamber 410 to heat the substrate (e.g., by way of a heated susceptor) from $T_2$ to a third temperature, $T_3$ (so as to remove the passivation layer on the substrate), and grow an epitaxial III-V layer on the pre-cleaned surface of the substrate. Controller 412 may configure $T_3$ to be between 50° C.-700° C.

Figure 5:
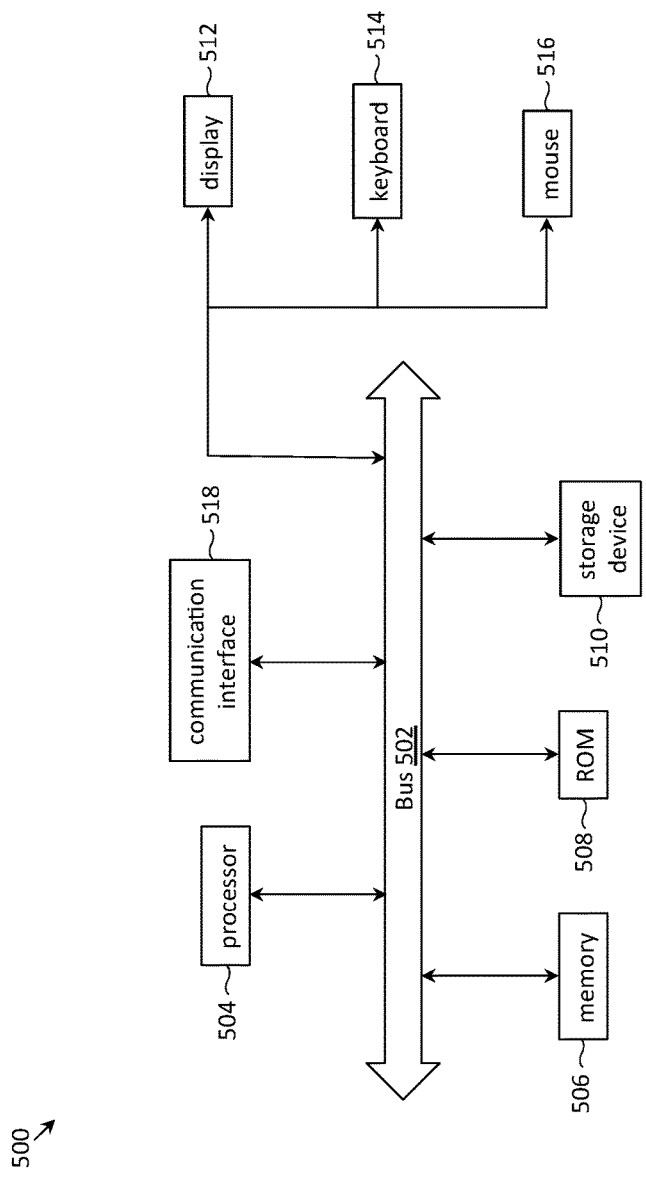
FIG. 5 depicts components of a computer system in which computer readable instructions instantiating the methods of the present invention may be stored and executed.

As is apparent from the foregoing discussion, aspects of the present invention involve the use of various computer systems and computer readable storage media having computer-readable instructions stored thereon. FIG. 5 provides an example of a system 500 that is representative of any of the computing systems discussed herein. Note, not all of the various computer systems have all of the features of system 500. For example, certain ones of the computer systems discussed above may not include a display inasmuch as the display function may be provided by a client computer communicatively coupled to the computer system or a display function may be unnecessary. Such details are not critical to the present invention.

System 500 includes a bus 502 or other communication mechanism for communicating information, and a processor 504 coupled with the bus 502 for processing information. Computer system 500 also includes a main memory 506, such as a random access memory (RAM) or other dynamic storage device, coupled to the bus 502 for storing information and instructions to be executed by processor 504. Main memory 506 also may be used for storing temporary variables or other intermediate information during execution of instructions to be executed by processor 504. Computer system 500 further includes a read only memory (ROM) 508 or other static storage device coupled to the bus 502 for storing static information and instructions for the processor 504. A storage device 510, which may be one or more of a floppy disk, a flexible disk, a hard disk, flash memory-based storage medium, magnetic tape or other magnetic storage medium, a compact disk (CD)-ROM, a digital versatile disk (DVD)-ROM, or other optical storage medium, or any other storage medium from which processor 504 can read, is provided and coupled to the bus 502 for storing information and instructions (e.g., operating systems, applications programs and the like).

Computer system 500 may be coupled via the bus 502 to a display 512, such as a flat panel display, for displaying information to a computer user. An input device 514, such as a keyboard including alphanumeric and other keys, may be coupled to the bus 502 for communicating information and command selections to the processor 504. Another type of user input device is cursor control device 516, such as a mouse, a trackball, or cursor direction keys for communicating direction information and command selections to processor 504 and for controlling cursor movement on the display 512. Other user interface devices, such as microphones, speakers, etc. are not shown in detail but may be involved with the receipt of user input and/or presentation of output.

The processes referred to herein may be implemented by processor 504 executing appropriate sequences of computer-readable instructions contained in main memory 506. Such instructions may be read into main memory 506 from another computer-readable medium, such as storage device 510, and execution of the sequences of instructions contained in the main memory 506 causes the processor 504 to perform the associated actions. In alternative embodiments, hard-wired circuitry or firmware-controlled processing units (e.g., field programmable gate arrays) may be used in place of or in combination with processor 504 and its associated computer software instructions to implement the invention. The computer-readable instructions may be rendered in any computer language. In general, all of the aforementioned terms are meant to encompass any series of logical steps performed in a sequence to accomplish a given purpose, which is the hallmark of any computer-executable application. Unless specifically stated otherwise, it should be appreciated that throughout the description of the present invention, use of terms such as "configuring", "processing", "computing", "calculating", "determining", "displaying", "receiving", "transmitting" or the like, refer to the action and processes of an appropriately programmed computer system, such as computer system 500 or similar electronic computing device, that manipulates and transforms data represented as physical (electronic) quantities within its registers and memories into other data similarly represented as physical quantities within its memories or registers or other such information storage, transmission or display devices.

Computer system 500 also includes a communication interface 518 coupled to the bus 502. Communication interface 518 may provide a two-way data communication channel with a computer network, which provides connectivity to and among the various computer systems discussed above. For example, communication interface 518 may be a local area network (LAN) card to provide a data communication connection to a compatible LAN, which itself is communicatively coupled to the Internet through one or more Internet service provider networks. The precise details of such communication paths are not critical to the present invention. What is important is that computer system 500 can send and receive messages and data through the communication interface 518 and in that way communicate with hosts accessible via the Internet.

Thus, methods and systems for pre-treating a surface of a substrate and growing an epitaxial III-V layer on the pre-treated surface have been described. It is to be understood that the above-description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for growing an epitaxial III-V layer on a substrate, the method comprising:

in a pre-clean chamber, and while the substrate is at a first temperature, $T_1$, exposing the substrate to a plasma, products of plasma decomposition, or both the plasma and the products of plasma decomposition so as to remove native oxide from the substrate and form a passivation layer on the substrate, wherein $T_1$ is greater than room temperature, and wherein the passivation layer comprises a hydrogen terminated (Si—H) surface;

in an oxygen-free environment, (a) transferring the substrate from the pre-clean chamber to a deposition chamber, and (b) cooling the substrate from $T_1$ to a second temperature, $T_2$; and in the deposition chamber, (a) heating the substrate from $T_2$ to a third temperature, $T_3$, so as to remove the passivation layer on the substrate, wherein removing the passivation layer comprises transforming the hydrogen terminated (Si—H) surface by flowing a group V precursor into the deposition chamber, and wherein 50° C.$<T_3<$700° C., and (b) growing the epitaxial III-V layer on the substrate, wherein growing the epitaxial III-V layer on the substrate comprises sequentially performing the following steps in the deposition chamber:

(i) cooling the substrate from $T_3$ to a fourth temperature, $T_4$;

(ii) when the substrate is at $T_4$, starting a flow of a group III precursor so as to deposit a III-V nucleation layer on the substrate;

(iii) stopping the flow of the group III precursor;

(iv) heating the substrate to a fifth temperature, $T_5$;

(v) when the substrate is at $T_5$, re-starting the flow of the group III precursor so as to deposit a bulk III-V layer over the III-V nucleation layer;
(vi) stopping the flow of the group III precursor; and
(vii) cooling the substrate from $T_5$ to a sixth temperature, $T_6$, wherein the flow of the group III precursor is stopped in step (iii), while the substrate temperature is less than $T_4$.

* * * * *